(12) United States Patent
Wang et al.

(10) Patent No.: US 7,928,507 B2
(45) Date of Patent: Apr. 19, 2011

(54) POLYSILICON CONTROL ETCH-BACK INDICATOR

(75) Inventors: Yu Wang, Fremont, CA (US); Tiesheng Li, San Jose, CA (US); Sung-Shan Tai, San Jose, CA (US); Hong Chang, Cupertino, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 12/653,130

(22) Filed: Dec. 9, 2009

(65) Prior Publication Data

US 2010/0084707 A1    Apr. 8, 2010

Related U.S. Application Data

(62) Division of application No. 11/413,248, filed on Apr. 29, 2006, now Pat. No. 7,632,733.

(51) Int. Cl.
*H01L 29/66* (2006.01)
*H01L 29/06* (2006.01)

(52) U.S. Cl. .................. 257/330; 257/622; 257/E21.53; 257/E21.585

(58) Field of Classification Search .................. 257/330, 257/622, 623, E23.179, E21.153, E21.585; 438/268–270, 430, 589
See application file for complete search history.

(56) References Cited

U.S. PATENT DOCUMENTS

2005/0173777 A1 * 8/2005 Grivna ..................... 257/510
* cited by examiner

*Primary Examiner* — Kiesha R Bryant
*Assistant Examiner* — Tucker Wright
(74) *Attorney, Agent, or Firm* — Bo-In Lin

(57) ABSTRACT

This invention discloses a semiconductor wafer for manufacturing electronic circuit thereon. The semiconductor substrate further includes an etch-back indicator that includes trenches of different sizes having polysilicon filled in the trenches and then completely removed from some of the trenches of greater planar trench dimensions and the polysilicon still remaining in a bottom portion in some of the trenches having smaller planar trench dimensions.

8 Claims, 6 Drawing Sheets

32λ　　16λ　　8λ　4λ　2λ

Poly end point boundary

US 7,928,507 B2

POLYSILICON CONTROL ETCH-BACK INDICATOR

This Patent Application is a Divisional Application and claims the Priority Date of a application Ser. No. 11/413,248 filed on Apr. 29, 2006 now U.S. Pat. No. 7,632,733 by common Inventors of this Application. The Disclosures made in the patent application Ser. No. 11/413,248 are hereby incorporated by reference.

BACKGROUND OF THE INVENTION

1. Field of the Invention

The invention relates generally to the semiconductor power devices. More particularly, this invention relates to an improved and novel manufacturing process and device configuration for controlling the depth of polysilicon etch-back from a trench wherein one of the applications is to provide the shielded trench gates having precisely controllable depth below the silicon top surface such that the reduction of gate to drain capacitance can be accurately achieved.

2. Description of the Prior Art

Conventional technologies for reducing the gate to drain capacitance Cgd in a DMOS device are still confronted with technical limitations and difficulties. Specifically, trenched DMOS devices are configured with trenched gates wherein large capacitance (Cgd) between gate and drain limits the device switching speed. The capacitance is mainly generated from the electrical field coupling between the bottom of the trenched gate and the drain. In order to reduce the gate to drain capacitance, an improved Shielded Gate Trench (SGT) structure is introduced at the bottom of the trenched gate to shield the trenched gates from the drain. The design concept of a SGT structure is to link the bottom of the trench to the source such that the trenched gates are shielded from the drain located at the bottom of the substrate as that shown in FIG. 1. A reduction of gate to drain capacitance to about half of the original Cgd value can be achieved by implementing the SGT structure in the bottom of the trenched gates. The switching speed and switching efficiency of the DMOS devices implemented with the SGT structure at the bottom of the trenched gates are therefore greatly improved.

As disclosed in U.S. Pat. Nos. 5,998,833 and 5,126,807, the shield gate trench (SGT) MOSFET is demonstrated as a promising solution in high speed switching applications with the SGT function as a floating gate in the lower part of the trench or fix to a source voltage. However, the challenge of the process is to control the depth of the floating gate that avoids the malfunction of the MOSFET. For this reason, great cares are required in the manufacturing processes in order to achieve the Cgd improvement by implementing such architecture. A particular time-etch of the polysilicon from the bottom of the gate trenches must be accurately controlled. FIG. 1A shows a DMOS device supported on a substrate 10. The substrate 10 includes an epitaxial layer 15 that has a trenched gate 20. The trenched gate 20 includes a polysilicon gate filled in the trenches with gate insulation layer 45. Under the trenched gate 20, a separated shielded gate trench (SGT) structure 30 is formed that includes polysilicon filling the trench bottom space separated from the trenched gate 20 with an insulation layer 40. The DMOS device further includes the body regions and source regions 50 and 60 as the standard DMOS devices. The depth of the bottom of the trenched gate, i.e., D as shown in FIG. 1A, is dependent on the etch rate of the polysilicon from the top portion of the trench when forming the SGT structure 30. A carefully controlled time etch is carried out to control the depth D.

FIGS. 1B and 1C show the processing steps to form the STG at the lower part of the trench gate. In FIG. 1B, the trench is filled with polysilicon. In FIG. 1C, a controlled polysilicon etch process is carried out to remove the polysilicon from the top of the trench until a designated depth, e.g., D is removed. However, the depth of the trench bottom D cannot be accurately controlled due to the variations of the etch speed of the polysilicon from the top portion of the trenches. This process is inherently difficult to control because this is not an end point etch. Thus leave the time control etch the only option. However, the etching rate highly depends on the trench sizes in active area and overall loading effect. Therefore, the etch time is different from product to product. As the feature size shrinking becomes technique trends nowadays, the floating gate etch control will become more challenging and tedious task.

As described above, even with accurate time control of an etch process, the depth of the polysilicon gate relative to the top surface of the silicon substrate cannot be controlled with sufficient accuracy. Variations of the gate depth are difficult to control because of the facts that in addition to the length of etch time, the speed of polysilicon etch at the bottom of the trenched gates is also dependent on several parameters that can all cause variations of the depth of the trenched gates. However, the variations of the depth of the gate bottom directly impact the device performance including the gate to drain capacitance. The variations of the gate depth further impact the difficulties in controlling the device channels. The reduction of the gate to drain capacitances cannot be fully realized unless special cares are implemented to control the etch speed of polysilicon from the trench bottom in order to control the depth of the trenched gates.

Therefore, a need still exists in the art of power semiconductor device design and manufacture to provide new manufacturing method and device configuration in forming the power devices such that the above discussed problems and limitations can be resolved.

SUMMARY OF THE PRESENT INVENTION

It is therefore an aspect of the present invention to provide a new and improved semiconductor power device with the shielded gate trench (SGT) structure implemented with polysilicon etch-back indicators for improving the precision of etch-back depth in forming the STG structure. The polysilicon etch-back indictors are provided either as digitized etch-back indicator or as analogy indicator for providing as a scale of etch-back time to control an etch-back depth into the trench. A functional or table-lookup type of correlation between the etch-back depth versus the size of the trench and etch-back time may be established through an etch-back operation performed on the indicator trenches of various sizes. By applying the functional correlation or a table that lists the actual data of etch-back depth versus trench-size, an etch-back time may be more accurately calibrated to remove the polysilicon to a designated depth depending on the size of the trench.

It is therefore, an aspect of the present invention to provide an etch-back indicator by opening a plurality of digitized trenches or tapered trench with continuous variation of trench width filled with polysilicon. An etch-back process is carried out on these etch-back indicators by utilizing the actual loading effect of the dry etch in the test runs right before the beginning of the actual manufacturing processes. These indicators are utilized to monitor the etch process for controlling the depth of etch-back to precisely control the depth of the polysilicon removal such that precise depth control of a dry etch is achieved.

Specifically, the control indicators are formed with trenches of different planar dimension with the polysilicon etched by applying the test run processes immediately prior to the beginning of the actual manufacturing processes. By using these etch-back control indicators as references, a more accurately control etch-back is achieved. Control of etch-back parameters including etch-back time for different trench sizes is more accurately calibrated to achieve more controllable and predicable etch-back depth.

Briefly in a preferred embodiment this invention discloses a semiconductor wafer for manufacturing electronic circuit thereon. The semiconductor substrate further includes an etch-back indicator that includes trenches of different sizes having polysilicon filled in the trenches and then completely removed from some of the trenches of greater planar trench dimensions and the polysilicon still remaining in a bottom portion in some of the trenches having smaller planar trench dimensions.

This invention further discloses a method to dispose an etch-back control indicator on a semiconductor wafer. The method includes a step of opening on the semiconductor wafer a plurality of trenches of different sizes. The method further includes a step of filling in the trenches with a polysilicon followed by applying an etch-back process to remove the polysilicon completely from some of the trenches having greater planar trench dimension and leaving a portion of the polysilicon in a bottom portion of some of the trenches of smaller planar trenches.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
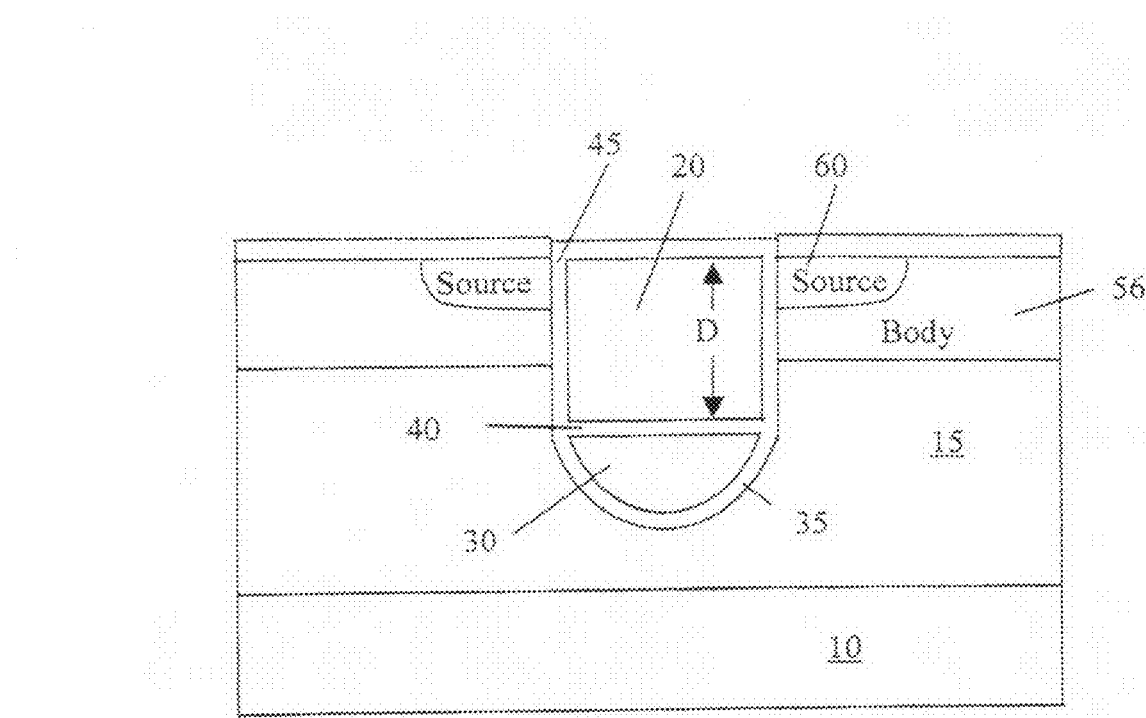
FIG. 1A is a cross sectional view of a conventional trenched MOSFET device implemented with a trenched gate configured with a conventional shielded gate trench (SGT) structure.
Figure 1B:
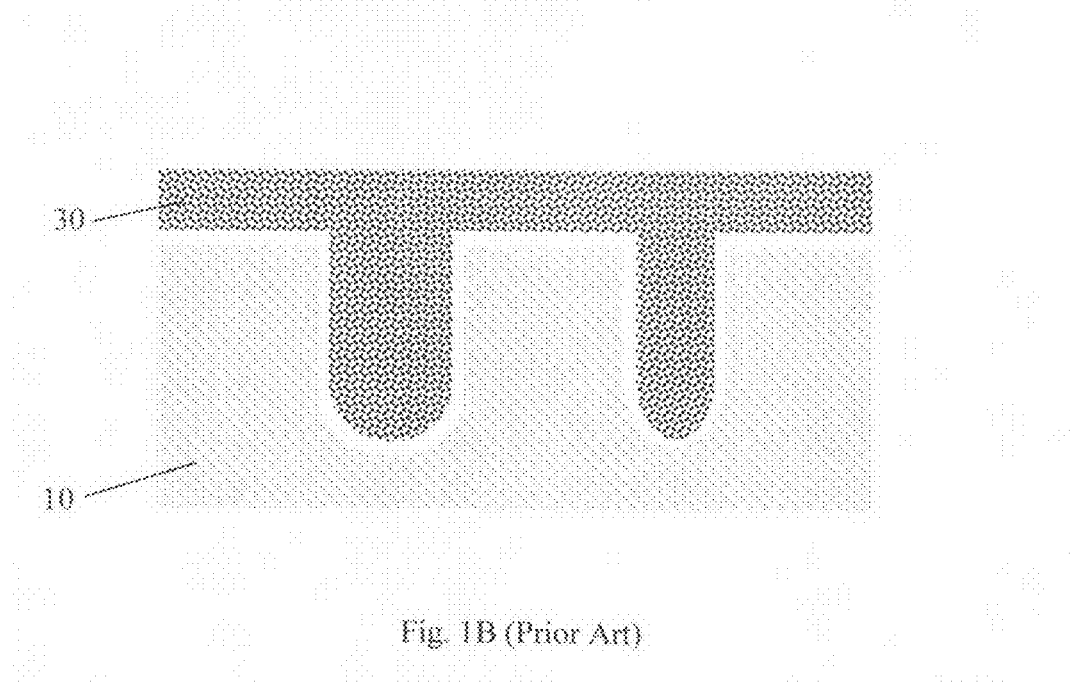
FIGS. 1B and 1C are cross sectional views for showing the processing steps to form the STG floating gate at the lower portion of the trench by removing the polysilicon from the top portion of the trench with a control polysilicon etch process.
Figure 1C:
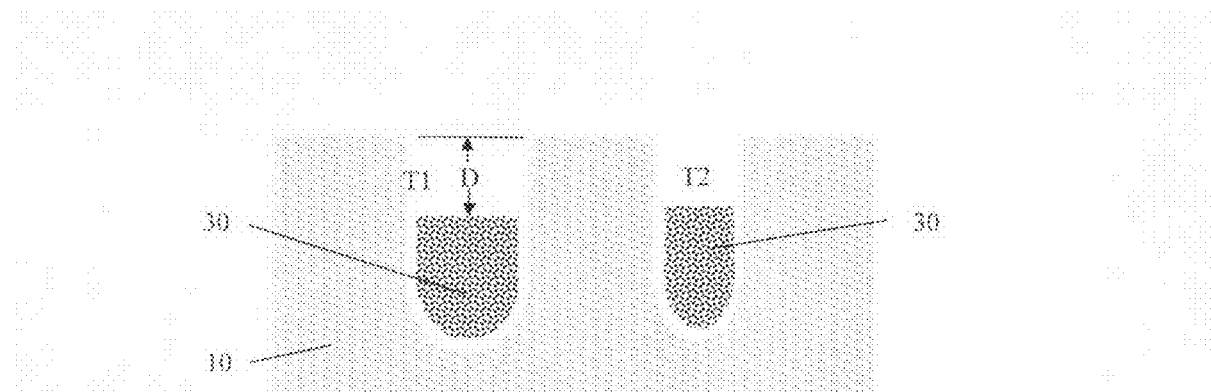
Figure 2A:
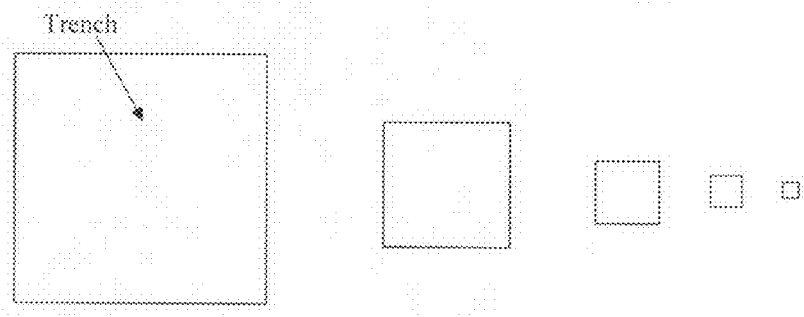
FIGS. 2A to 2C are cross sectional views for showing a layout of control etch indicators as discrete trenches of different sizes to provide precise controllable time etch process for removing the polysilicon to a designated depth.
Figure 2B:
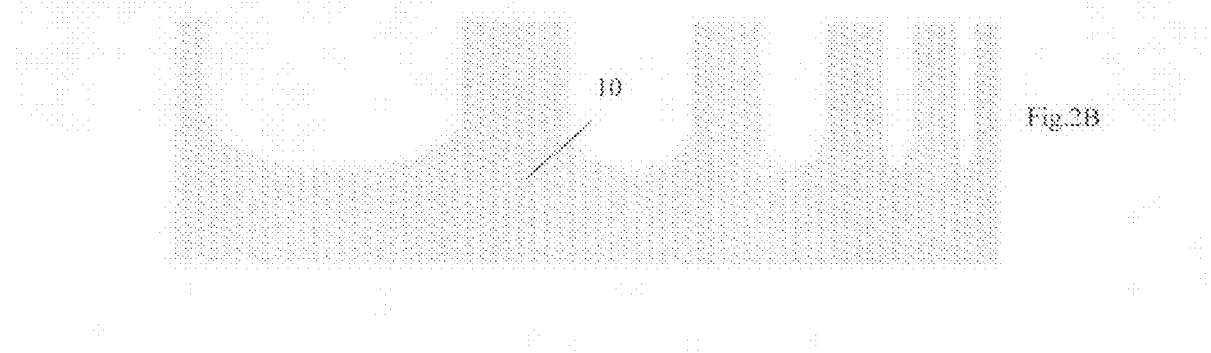
Figure 2C:
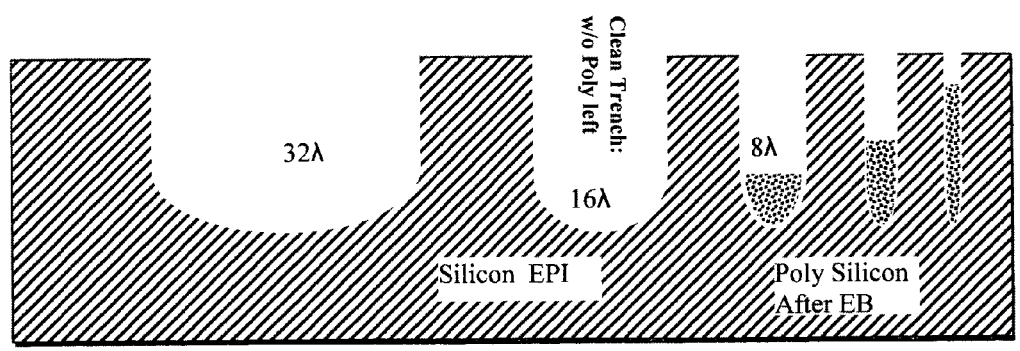
Figure 3A:
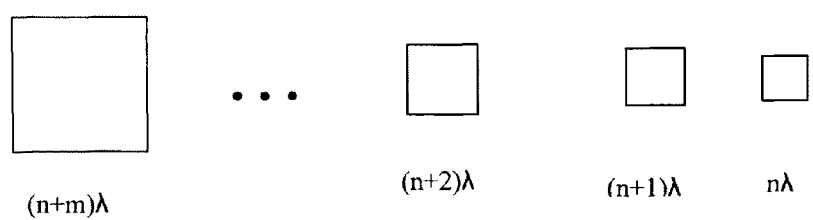
FIGS. 3A to 3C are cross sectional views for showing an alternate layout of control etch indicators as discrete trenches of different sizes to provide precise controllable time etch process for removing the polysilicon to a designated depth.
Figure 3B:
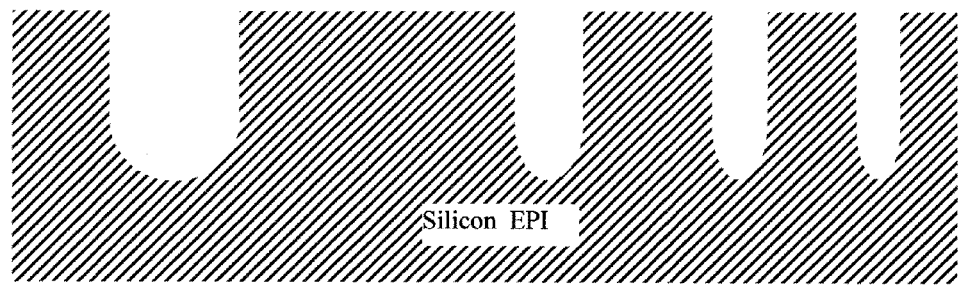
Figure 3C:
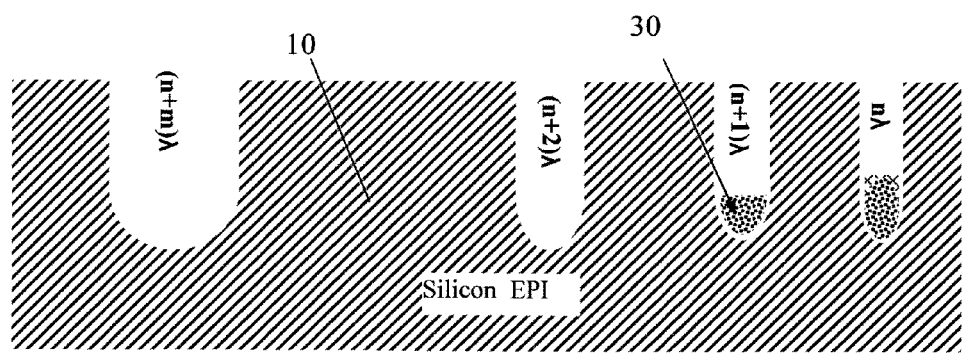

Referring to FIGS. 2A to 2C and 3A to 3C for the layouts of two sets of digital control etch indicators of this invention. FIGS. 2A and 3A show two arrays of square boxes. FIG. 2A shows the array of boxes having a length and width of $2\lambda$, $4\lambda$, $8\lambda$, $16\lambda$, and $32\lambda$. FIG. 3A shows the array of boxes having a length and width of $n\lambda$, $(n+1)\lambda$, $(n+2)\lambda$, ..., $(n+m)\lambda$. In carrying out a control etch to remove the polysilicon from the trenches of different sizes, the polysilicon etch process progresses in the trenches of different sizes has different etch rates. The bigger size of the trench the faster the etch rate. Therefore, as shown in FIGS. 2C and 3C, the trenches have smaller sizes still has polysilicon left in the trench due to a slower etch rate. This leads to the complete remove of the polysilicon in the biggest trench first followed by complete removal of the polysilicon from the second largest trench and so on during a polysilicon etch-back process. The "clean trench" that has all the polysilicon removed is propagated sequentially from a trench to the next smaller trench. Therefore, this trench array forms a series "milestone" to indicate various degrees of the polysilicon etch-back in trenches of different sizes.

Figure 2D:
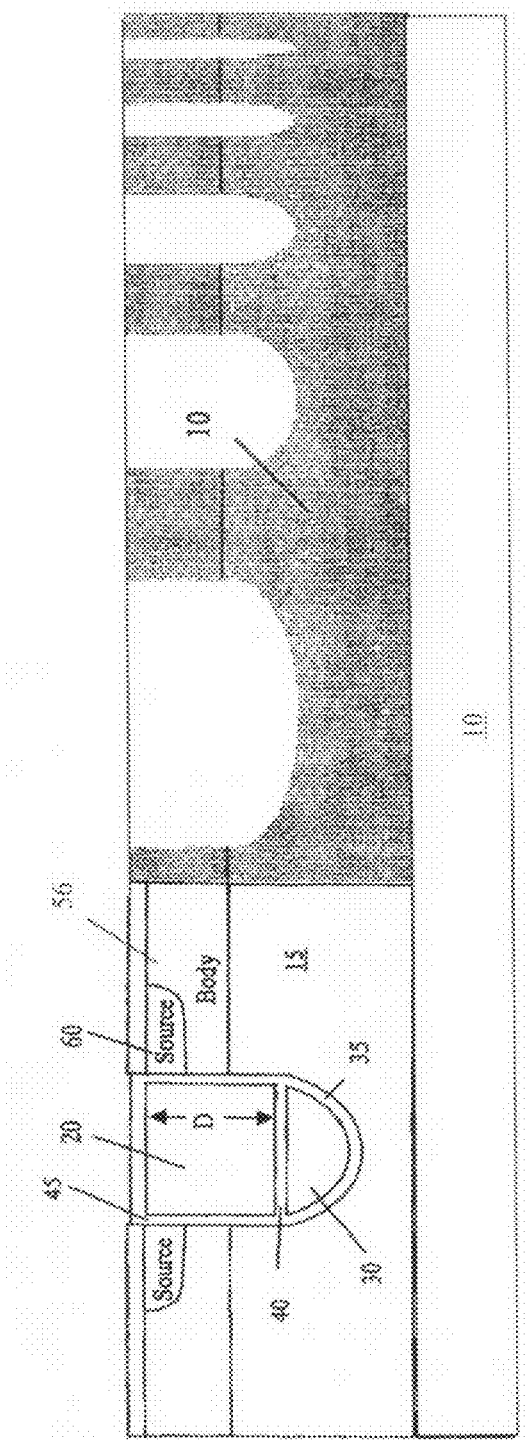
FIG. 2D is a cross sectional view of a MOSFET device formed on a semiconductor wafer of this invention.

FIG. 2D is a cross sectional view for a MOSFET device formed on a semiconductor wafer of this invention. The semiconductor wafer has an etch-back indicator including trenches of different planar dimensions having polysilicon filled in the trenches wherein the polysilicon are completely removed from some of the trenches of greater planar dimensions and the polysilicon still remaining in a bottom portion in some of the trenches having smaller planar dimensions. The semiconductor power device includes a metal oxide semiconductor field effect transistor (MOSFET) device including a trenched gate having a shielded gate trench (SGT) insulated from and disposed below the trenched gate.

FIG. 2C and FIG. 3C demonstrate two cases after the polysilicon etch-back. In the FIG. 2C, the trenches of $32\lambda$ and $16\lambda$ width are "clean trenches" and trench of $8\lambda$ is not. Therefore, the $16\lambda$ trench become a checkpoint to indicate how deep the polysilicon is removed form the top of the trench. In the FIG. 3C, $(n+3)\lambda$ trench become a checkpoint. By setting up the correlation of floating gate depth and the checkpoint, a vertical measurement of floating gate depth can be monitored and controlled by a planner measurement. This is a much easier way to measure and monitor the gate depth especially when the trench width becomes smaller and smaller. Therefore, tests runs can be performed on a series of trenches formed as etch-back control indicators. The etch-back process can be performed on these trenches by first filling these trenches with polysilicon followed by performing polysilicon etch-back processes of different controlled etch-back times. The depths of etch-back as functions of the etch-back time and the planar dimension of the trenches are recorded. These recorded etch-back depth as functions of etch-back time and trench size are then applied as etch-back indicators to provide useful reference to carry out etch-back process in forming the electronic device on the semiconductor where control etch-back time is required.

FIGS. 2A to 2C and FIGS. 3A to 3C are exemplary embodiments that apply two different discreet trench size arrays as "milestones" to function as digital pattern for correlating etch-back depth to planar trench size. FIGS. 2A to 2C employ an array of trenches with sizes arranged according to the binary weighted trench sizes. FIGS. 3A to 3C employ an array of trenches with sizes arranged according to a linear weighted trench sizes. With these array of trenches of different trench sizes to measure the ranges of depth of a control etch-back process, the depth of polysilicon etch-back can be more precisely controlled.

Figure 4A:
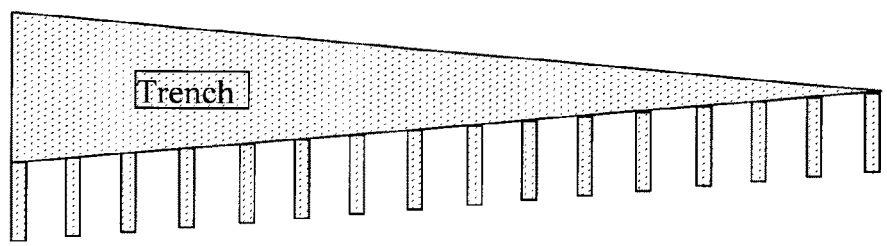
FIGS. 4A and 4B are top views for showing a tapered trench with continuous variation of trench width to correlate precisely controllable etch time for removing the polysilicon to a designated depth.
Figure 4B:
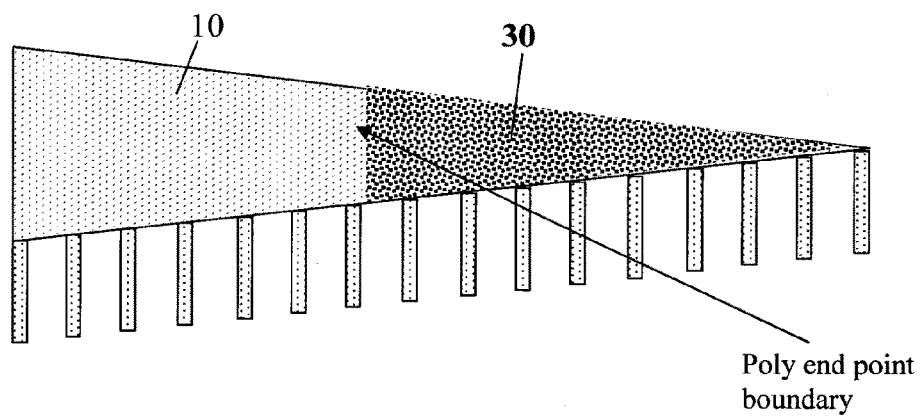

FIG. 4A is a top view of a taper-shaped trench that has continuously increasing width. This taper-shaped trench can be applied as an analogy indicator for indicating the depth of control etch-back in removing the polysilicon during the process of forming the STG at the lower portion of the trenched gate. FIG. 4B shows the polysilicon is totally removed from the trenches where the trench has greater width. The polysilicon still remains in the portion where the trench width is smaller. A ruler is formed on the side of the trench to help measure the boundary of endpoint of polysilicon in the trench both continuously and precisely.

According to above descriptions and drawings, this invention discloses an electronic device disposed on a semiconductor wafer. The semiconductor wafer further includes an etch-back indicator including trenches of different planar dimensions having polysilicon filled in the trenches wherein the polysilicon are completely removed from some of the trenches of greater planar dimensions and the polysilicon still remaining in a bottom portion in some of the trenches having smaller planar dimensions. In a specific embodiment, the trenches of different planar dimensions further constituting an array of trenches having planar dimensions sequentially increased approximately according to a mathematical formula. In another preferred embodiment, the trenches of different planar dimensions further constituting an array of trenches having planar dimensions sequentially increased according to a mathematical formula of approximately doubling a planar dimension in each of next trenches in the array of trenches. In another preferred embodiment, the trenches of different planar dimensions further constituting an array of trenches having planar dimensions sequentially increased according to a mathematical formula of adding approximately a fixed amount to a planar dimension in each of next trenches in the array of trenches. In another preferred embodiment, the trenches of different planar dimensions further constituting an array of approximately square-shaped trenches each having a width and a length sequentially increased. In another preferred embodiment, the trenches of different planar dimensions further constituting an array of approximately square-shaped trenches each having a width and a length sequentially increased according to approximately a mathematical formula. In another preferred embodiment, the trenches of different planar dimensions further constituting an array of approximately square-shaped trenches each having a width and a length sequentially increased according to a mathematical formula of approximately doubling the width and length in each of next trenches in the array of trenches. In another preferred embodiment, the trenches of different planar dimensions further constituting an array of approximately square-shaped trenches each having a width and a length sequentially increased according to a mathematical formula of adding approximately a fixed amount to a width and length in each of next trenches in the array of trenches. In another preferred embodiment, the electronic device further includes a semiconductor power device includes a trenched gate having a shielded gate trench (GST) insulated from and disposed below the trenched gate. In another preferred embodiment, the electronic device further includes a metal oxide semiconductor field effect transistor (MOSFET) device including a trenched gate having a shielded gate trench (GST) insulated from and disposed below the trenched gate. In another preferred embodiment, the polysilicon further includes a doped polysilicon.

In a different embodiment, this invention further discloses an electronic device disposed on a semiconductor wafer wherein the semiconductor wafer further includes an etch-back indicator including a tapered elongated trench with gradually decreasing width having polysilicon filled in the trench wherein the polysilicon are completely removed from a segment of the trench of greater width and the polysilicon still remaining in a bottom portion in a segment of the trench having smaller width. In a preferred embodiment, the tapered elongate trench includes substantially an elongated triangular shaped trench In a preferred embodiment, the polysilicon further includes a doped polysilicon. In a preferred embodiment, the tapered elongate trench wherein the width of the trench gradually decreasing according to a mathematical formula. In a preferred embodiment, the electronic device further includes a semiconductor power device includes a trenched gate having a shielded gate trench (GST) insulated from and disposed below the trenched gate. In a preferred embodiment, the electronic device further includes a metal oxide semiconductor field effect transistor (MOSFET) device including a trenched gate having a shielded gate trench (GST) insulated from and disposed below the trenched gate.

The indicators can be applied for products with different loading effect, or different trench sizes and for products with different gate depth requirement, since the trench array contains the whole "spectrum" of the trench sizes. By setting up the correlations of the checkpoint in the indicators and the gate depth. The device structure can be well controlled. The processes to actually open a trench followed by polysilicon etch-back are performed on two trenches of trench width 0.6 micrometers and 1.2 micrometers respectively. The substrate is composed of silicon epitaxial material and the etch-back is performed on the polysilicon filling in the trenches. The inline data measurements show that the depths of the trenches have only about ~6% difference, while the polysilicon etch depth difference is >56%. Therefore, the loading effect of the material that forms the shielded gate trench (SGT), i.e., the polysilicon is much more significant than substrate material, i.e., the epitaxial silicon material. Because of these significant differences, the control etch-back indicators of this invention provide very practical useful references for calibrating the etch-back process to accurately control the etch-back depth. Furthermore, it is also measured that the etch-back process when carried out on a lightly doped polysilicon, a much uniformly etched and flat top profile is obtained. The lightly doped polysilicon therefore provides more precise measurable top surface for controlling the etch-back depth. Since the SGT functions as a shielding block for reducing the gate to drain capacitance, the polysilicon that remains at the bottom of the trench does not involve in an electrical function of charging or discharging during the MOSFET operations. For these reasons, the light doped polysilicon does not affect or degrade the device performance. The lightly doped polysilicon is therefore used provide the control etch-back indicators.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:
1. A semiconductor wafer for forming an electronic device therein wherein said semiconductor wafer comprising:
an etch-back indicator including trenches of different planar dimensions having a polysilicon filled in said trenches wherein said polysilicon are completely removed from some of the trenches of greater planar dimensions and said polysilicon still remaining in a bottom portion in some of said trenches having smaller planar dimensions; and said trenches of different planar dimensions further constituting an array of approximately square-shaped trenches each having a width and a length sequentially increased.

2. The semiconductor wafer of claim 1 wherein: said trenches of different planar dimensions further constituting an array of trenches having planar dimensions sequentially increased according to a mathematical formula of adding approximately a fixed amount to a planar dimension in each of next trenches in said array of trenches.

3. The semiconductor wafer of claim 1 wherein:
said trenches of different planar dimensions further constituting an array of approximately square-shaped trenches each having a width and a length sequentially increased according to approximately a mathematical formula.

4. The semiconductor wafer of claim 1 wherein:
said trenches of different planar dimensions further constituting an array of approximately square-shaped trenches each having a width and a length sequentially increased according to a mathematical formula of approximately doubling said width and length in each of next trenches in said array of trenches.

5. The semiconductor wafer of claim 1 wherein: said trenches of different planar dimensions further constituting an array of approximately square-shaped trenches each having a width and a length sequentially increased according to a mathematical formula of adding approximately a fixed amount to a width and length in each of next trenches in said array of trenches.

6. The semiconductor wafer of claim 1 further comprising:
a semiconductor power device includes a trenched gate having a shielded gate trench (SGT) insulated from and disposed below said trenched gate.

7. The semiconductor wafer of claim 1 further comprising:
a metal oxide semiconductor field effect transistor (MOSFET) device including a trenched gate having a shielded gate trench (SGT) insulated from and disposed below said trenched gate.

8. The semiconductor wafer for forming said electronic device therein of claim 1 wherein:
said electronic device further comprising a doped polysilicon filled in said trenches.

* * * * *